United States Patent
Park et al.

(10) Patent No.: US 12,475,836 B2
(45) Date of Patent: Nov. 18, 2025

(54) DISPLAY MODULE

(71) Applicant: SAMSUNG ELECTRONICS CO., LTD., Suwon-si (KR)

(72) Inventors: Wonkeun Park, Suwon-si (KR); Youngki Jung, Suwon-si (KR); Donghwan Kim, Suwon-si (KR); Donghun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/436,692

(22) Filed: Feb. 8, 2024

(65) Prior Publication Data

US 2024/0212581 A1   Jun. 27, 2024

Related U.S. Application Data

(63) Continuation of application No. PCT/KR2023/021002, filed on Dec. 19, 2023.

(30) Foreign Application Priority Data

Dec. 22, 2022  (KR) ........................ 10-2022-0181715

(51) Int. Cl.
  *H10D 86/60*   (2025.01)
  *G09G 3/32*    (2016.01)
  (Continued)

(52) U.S. Cl.
  CPC ............. *G09G 3/32* (2013.01); *H01L 25/167* (2013.01); *H10D 86/441* (2025.01);
  (Continued)

(58) Field of Classification Search
  None
  See application file for complete search history.

(56) References Cited

U.S. PATENT DOCUMENTS 8,259,095 B2   9/2012   Cok et al.
10,838,259 B2  11/2020  Mori
(Continued)

FOREIGN PATENT DOCUMENTS

EP        3871211 B1        5/2023
KR    10-2012-0062743 A     6/2012
(Continued)

OTHER PUBLICATIONS

International Search Report (PCT/ISA/210) issued by the International Searching Authority on Mar. 27, 2024 in corresponding International Application No. PCT/KR2023/021002.
(Continued)

*Primary Examiner* — Duane N Taylor, Jr.
(74) *Attorney, Agent, or Firm* — Sughrue Mion, PLLC

(57) ABSTRACT

A display module includes: a substrate; a first driving circuit provided in a center area on the substrate in a vertical form; a first pixel array formed on a left area of the substrate relative to the first driving circuit, wherein the first pixel array may include a first plurality of pixels disposed in a matrix form; and a second pixel array formed on a right area of the substrate relative to the first driving circuit, wherein the second pixel array may include a second plurality of pixels disposed in the matrix form, wherein each pixel of the first plurality of pixels and each pixel of the second plurality of pixels may include a plurality of inorganic light emitting devices, and wherein each of the first pixel array and the second pixel array are separated from the first driving circuit by a pre-set distance.

15 Claims, 6 Drawing Sheets

(51) Int. Cl.
  *H01L 25/16* (2023.01)
  *H10D 86/40* (2025.01)

(52) U.S. Cl.
  CPC ..... *H10D 86/60* (2025.01); *G09G 2300/0408* (2013.01); *G09G 2300/0413* (2013.01); *G09G 2320/0233* (2013.01)

(56) References Cited

U.S. PATENT DOCUMENTS

| | | |
|---|---|---|
| 11,107,841 B2 | 8/2021 | Jang et al. |
| 11,201,202 B2 | 12/2021 | Kim et al. |
| 11,320,701 B2 | 5/2022 | Mori |
| 11,551,605 B2 | 1/2023 | Kim et al. |
| 11,598,992 B2 | 3/2023 | Mori |
| 11,852,924 B2 | 12/2023 | Mori |
| 2011/0043499 A1 | 2/2011 | Cok et al. |
| 2015/0138466 A1 | 5/2015 | Mori |
| 2015/0187810 A1 | 7/2015 | Lee |
| 2018/0114500 A1 | 4/2018 | Jung et al. |
| 2021/0072575 A1 | 3/2021 | Mori |
| 2021/0210002 A1 | 7/2021 | Kim et al. |
| 2021/0217353 A1 | 7/2021 | Zhao et al. |
| 2022/0149112 A1 | 5/2022 | Hwang et al. |
| 2022/0244588 A1 | 8/2022 | Mori |
| 2023/0101460 A1 | 3/2023 | Kim et al. |
| 2023/0205019 A1 | 6/2023 | Mori |

FOREIGN PATENT DOCUMENTS

| | | | |
|---|---|---|---|
| KR | 10-1608165 B1 | 3/2016 | |
| KR | 10-2020-0036290 A | 4/2020 | |
| KR | 10-2020-0036586 A | 4/2020 | |
| KR | 10-2020-0057198 A | 5/2020 | |
| KR | 10-2151099 B1 | 9/2020 | |
| KR | 10-2020-0114980 A | 10/2020 | |
| KR | 10-2174003 B1 | 11/2020 | |
| KR | 10-2021-0087873 A | 7/2021 | |
| KR | 10-2021-0131853 A | 11/2021 | |
| KR | 10-2022-0037329 A | 3/2022 | |
| KR | 10-2022-0061495 A | 5/2022 | |
| WO | WO-2021137663 A1 * | 7/2021 | ........... G09G 3/2014 |

OTHER PUBLICATIONS

Written Opinion (PCT/ISA/237) issued by the International Searching Authority on Mar. 27, 2024 in corresponding International Application No. PCT/KR2023/021002.
Commuincation dated Aug. 12, 2025, issued by the European Patent Office in European Application No. 23907691.2.

* cited by examiner

RELATED ART

DISPLAY MODULE

CROSS-REFERENCE TO RELATED APPLICATIONS

This application is a bypass continuation of International Application No. PCT/KR2023/021002, filed on Dec. 19, 2023, which is based on and claims priority to Korean Patent Application No. 10-2022-0181715, filed on Dec. 22, 2022, in the Korean Intellectual Property Office, the disclosures of which are incorporated by reference herein in their entireties.

BACKGROUND

1. Field

The disclosure relates to a display module, and more particularly, to a display apparatus which includes a pixel array formed of self-emissive devices.

2. Description of Related Art

A bezel-less display module of the related art has been designed to operate a display module by providing a driving circuit (e.g., gate driver) in between pixels In this case, a display module of the related art may be configured such that an active area and a bezel are not divided on a substrate, a phenomenon of a signal between a pixel and a driving circuit being coupled may occur, and there has been a problem of a design density not being uniform on the substrate.

In addition, if a data line corresponding to a pixel is partially overlapped with the driving circuit, a non-uniformity problem of a signal coupling occurring with the data line according to driving of the driving circuit, the driving of the driving circuit affecting a specific pixel and brightness of the specific pixel being deteriorated compared to remaining pixels, or the like may occur.

However, a presence of a specific area (e.g., bezel area) for disposing the driving circuit may be a limitation from a design aspect when implementing at least one display apparatus through a plurality of display modules, and specifically, there may be a difficult problem of providing a seamless image due to the bezel that is present at a coupling part when forming a large-scaled display panel by coupling the plurality of display module.

SUMMARY

According to an aspect of the disclosure, a display module includes: a substrate; a first driving circuit provided in a center area on the substrate in a vertical form; a first pixel array formed on a left area of the substrate relative to the first driving circuit, wherein the first pixel array may include a first plurality of pixels disposed in a matrix form; and a second pixel array formed on a right area of the substrate relative to the first driving circuit, wherein the second pixel array may include a second plurality of pixels disposed in the matrix form, wherein each pixel of the first plurality of pixels and each pixel of the second plurality of pixels may include a plurality of inorganic light emitting devices, and wherein each of the first pixel array and the second pixel array are separated from the first driving circuit by a pre-set distance.

The display module may further include: a plurality of second driving circuits formed on the substrate, the plurality of second driving circuits are configured to drive the plurality of inorganic light emitting devices of the first plurality of pixels and the second plurality of pixels, and the first driving circuit is configured to generate control signals based on clock signals applied through at least one clock line, and to drive the plurality of second driving circuits by providing the generated control signals to the plurality of second driving circuits.

The at least one clock line may overlap the first driving circuit on the substrate.

The vertical form of the first driving circuit may divide the substrate into the left area and the right area, and the first plurality of pixels may be in close contact with one another and the second plurality of pixels may be in close contact with one another.

The first plurality of pixels may be in direct contact with one another and the second plurality of pixels may be in direct contact with one another.

The plurality of inorganic light emitting devices in the first pixel array may be spaced apart from one another, and the plurality of inorganic light emitting devices in the second pixel array may be spaced apart from one another.

A portion of an upper area and a portion of a lower area in the left area may be a first redundant area in which an inorganic light emitting device is not disposed, and a portion of the upper area and a portion of the lower area in the right area may be a second redundant area in which an inorganic light emitting device is not disposed.

The display module may further include: a first dummy first driving circuit disposed at an outer portion of the left area; a second dummy first driving circuit disposed at an outer portion of the right area, and each of the first dummy first driving circuit and the second dummy first driving circuit may be configured to maintain a same potential as the first driving circuit.

The left area of the substrate and the right area of the substrate may be symmetrical across the vertical form of the first driving circuit.

Each of the first driving circuit, the first dummy first driving circuit and the second dummy first driving circuit may include a thin film transistor.

According to an aspect of the disclosure, a display module includes: a substrate; a first driving circuit on the substrate and configured to divide the substrate into a first side and a second side; a first pixel array on the first side of the substrate, the first pixel array including a first plurality of pixels; and a second pixel array on the second side of the substrate, the second pixel array including a second plurality of pixels, wherein the first plurality of pixels and the second plurality of pixels may be arranged in a matrix form, wherein each pixel of the first plurality of pixels and each pixel of the second plurality of pixels may include a plurality of inorganic light emitting devices, and wherein each of the first pixel array and the second pixel array may be separated from the first driving circuit by a pre-set distance.

The display module may further include: a plurality of second driving circuits on the substrate; at least one data line on the substrate; and at least one clock line on the substrate, wherein the plurality of second driving circuits may be configured to drive the plurality of inorganic light emitting devices of the first plurality of pixels and the second plurality of pixels, and wherein the first driving circuit is configured to generate control signals based on clock signals applied through the at least one clock line, and to drive the plurality of second driving circuits by providing the generated control signals to the plurality of second driving circuits.

The at least one clock line overlaps the first driving circuit on the substrate.

Adjacent pixels of the first plurality of pixels may be in close contact with one another and adjacent pixels of the second plurality of pixels may be in close contact with one another.

Adjacent pixels of the first plurality of pixels may be in direct contact with one another and adjacent pixels of the second plurality of pixels may be in direct contact with one another.

Adjacent inorganic light emitting devices of the plurality of inorganic light emitting devices may be spaced apart from one another.

The display module may further include: a first redundant area at an upper edge portion of the first side and a lower edge portion of the first side; and a second redundant area at an upper edge portion of the second side and a lower edge portion of the second side, and no inorganic light emitting devices may be in the first redundant area and the second redundant area.

The display module may further include: a first dummy first driving circuit on an edge of the first side opposite from the first driving circuit; a second dummy first driving circuit on an edge of the second side opposite from the first driving circuit, wherein each of the first dummy first driving circuit and the second dummy driving circuit is configured to maintain a same potential as the first driving circuit.

The first side and the second side may be symmetrical across the first driving circuit.

According to an aspect of the disclosure, a display module includes: a substrate; a first pixel array on a first side of the substrate, the first pixel array including a first plurality of pixels; a second pixel array on a second side of the substrate, the second pixel array including a second plurality of pixels; and a first driving circuit on the substrate between the first pixel array and the second pixel array, wherein each of the first pixel array and the second pixel array may be separated from the first driving circuit by a pre-set distance.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

In the disclosure, in case it is determined that the detailed description of related known technologies may unnecessarily confuse the gist of the disclosure, the detailed description thereof will be omitted. In addition, redundant descriptions of same configurations will likely be omitted.

Suffixes such as "part" for elements used in the description below have been added or used combined therewith considering its easiness in preparing the disclosure, and do not have meaning or role that distinguishes one another on its own.

Terms used in the disclosure have been used to describe one or more embodiments, and are not intended to be limiting. A singular expression includes a plural expression, unless otherwise specified.

In the disclosure, it is to be understood that the terms such as "have" or "include" are used herein to designate a presence of a characteristic, number, step, operation, element, component, or a combination thereof, and not to preclude a presence or a possibility of adding one or more of other characteristics, numbers, steps, operations, elements, components or a combination thereof.

Expressions such as "first," "second," "1st," "2nd," and so on used herein may be used to refer to various elements regardless of order and/or importance, and it should be noted that the expressions are merely used to distinguish an element from another element and not to limit the relevant elements.

When a certain element (e.g., first element) is indicated as being "(operatively or communicatively) coupled with/to" or "connected to" another element (e.g., second element), it may be understood as the certain element being directly coupled with/to the another element or as being coupled through other element (e.g., third element). Alternatively, when a certain element (e.g., first element) is indicated as "directly coupled with/to" or "directly connected to" a certain element (e.g., first another element (e.g., second element)), it may be understood as the other element (e.g., third element) not being present between the certain element and the another element.

As used herein, the expression "at least one of a, b or c" indicates "only a," "only b," "only c," "both a and b," "both a and c," "both b and c," or "all of a, b, and c."

The terms used in the embodiments of the disclosure may be interpreted to have meanings generally understood to one of ordinary skill in the art unless otherwise defined.

The various embodiments of the disclosure will be described in detail below with reference to the accompanied drawings.

Figure 1:
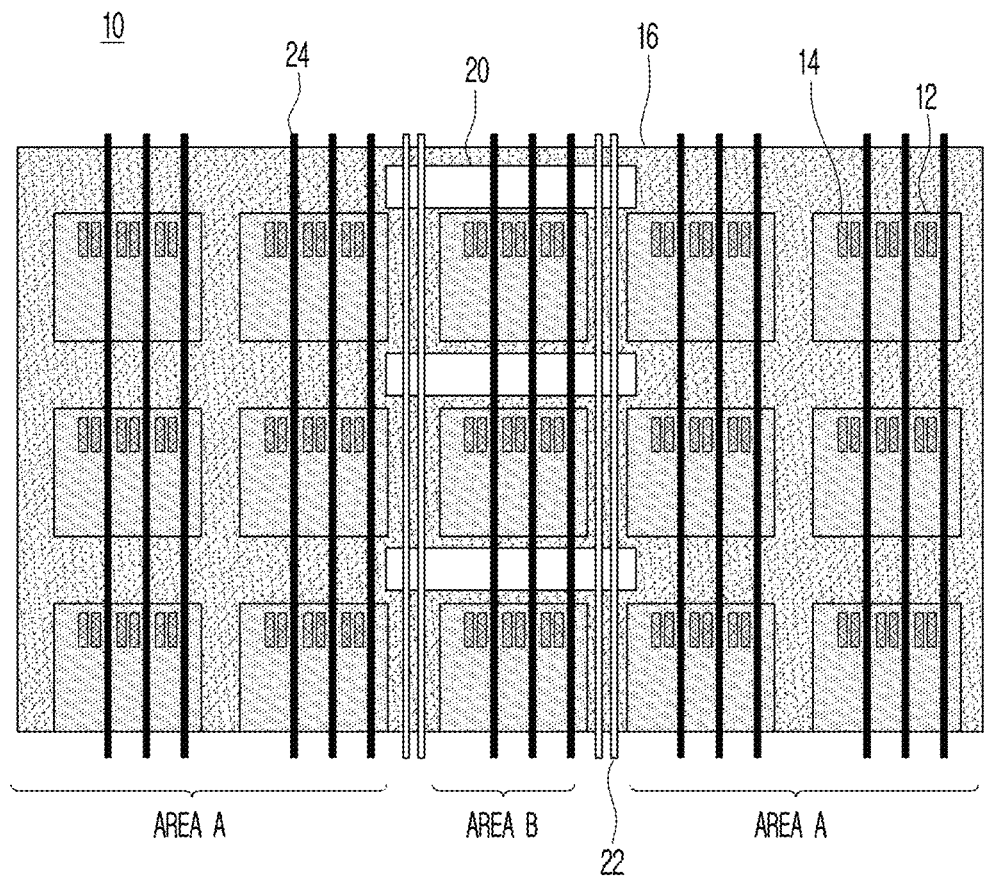
FIG. 1 is a diagram illustrating a pixel structure according to a display module of the related art.

FIG. 1 is a diagram illustrating a pixel structure according to a display module of the related art.

Referring to FIG. 1, the display module of the related art may include pixel areas 12 which include a plurality of inorganic light emitting devices 14 on a substrate 16.

For example, a bezel-less display module of the related art has been designed to operate the display module by providing a driving circuit (e.g., a gate driver) in-between pixels.

In this case, the display module of the related art may be configured such that an active area and a bezel are not divided on the substrate, which may cause a phenomenon of a signal between the pixel and the driving circuit being coupled, and there has been a problem of a design density not being uniform on the substrate.

For example, referring to FIG. 1, the display module 10 of the related art may include a plurality of pixels, that is, a pixel array disposed (or arranged) in a matrix form.

The pixel array may include a plurality of row lines or a plurality of column lines. In certain cases, a row line may be referred to as a horizontal line, and a column line may be referred to as a vertical line, where Area A includes columns of pixels without a driving circuit, and Area B includes a column of pixels with driving circuits.

The display module 10 of the related art may include a first driving circuit 20 (e.g., a gate driver or a scan driver) between a plurality of pixels, and may include a clock line 22 for applying a clock signal (or, gate in panel (GIP)) to the first driving circuit 20.

As shown in FIG. 1, the first driving circuit 20 may be disposed in a horizontal direction between the plurality of pixels of Area B, and because a data line 24 (or, a pixel line) corresponding to the pixels disposed between a plurality of first driving circuits 20 is overlapped with the plurality of first driving circuits 20, a signal coupling phenomenon may occur, and there may be a problem of the driving (or, signal output) of the first driving circuit 20 affecting a pixel adjacently disposed (e.g., a difference in brightness with other pixels occurring).

In addition, as shown in FIG. 1, an undesired mura may be generated in a pixel adjacent to the clock line 22 for applying the clock signal to the first driving circuit 20.

Below, while implementing a bezel-less display module according to one or more embodiments of the disclosure, various methods of minimizing the occurrence of the signal coupling phenomenon between the clock line and the data line, or the overlapping of devices and minimizing the occurrence of non-uniformity between the plurality of pixels, an image quality defect, and an image quality distortion phenomenon due to mura occurring from a portion of the pixels from among the plurality of pixels, will be described.

Figure 2:
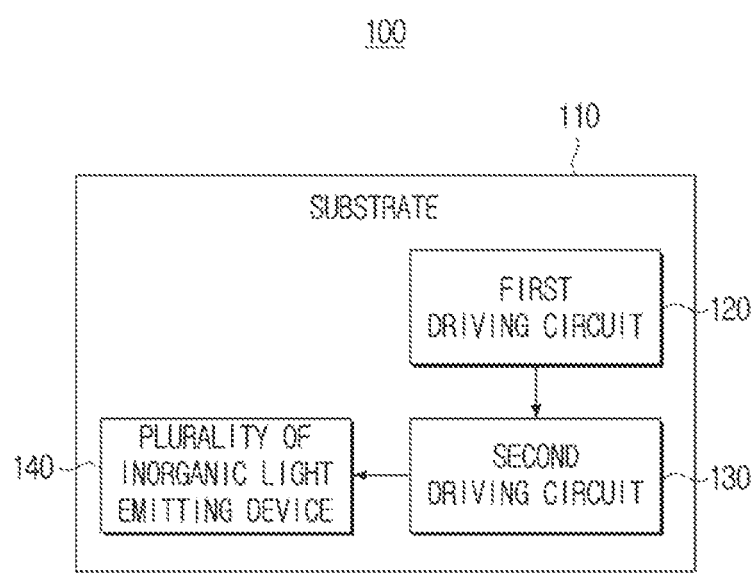
FIG. 2 is a block diagram illustrating a display module according to one or more embodiments of the disclosure.

FIG. 2 is a block diagram illustrating a display module according to one or more embodiments of the disclosure.

Referring to FIG. 2, a display module 100 according to an embodiment of the disclosure may include a substrate 110, a first driving circuit 120, a second driving circuit 130, and a plurality of inorganic light emitting devices 140.

The first driving circuit 120 may be provided on the substrate 110 according to an embodiment of the disclosure, and the first driving circuit 120 may be in a vertical form. For example, the first driving circuit 120 may be provided in the vertical form in a center area on the substrate.

The display module 100 according to an embodiment may be formed at a left area of the substrate 110 relative to the first driving circuit 120, and may include a first pixel array in which each pixel that includes the plurality of inorganic light emitting devices 140 is disposed in the matrix form.

In addition, the display module 100 may be formed at a right area of the substrate 110 relative to the first driving circuit 120, and may include a second pixel array in which each pixel that includes the plurality of inorganic light emitting devices 140 is disposed in the matrix form.

The display module 100 may be formed with a driving circuit layer 112 on the substrate 110, and may have a structure in which an inorganic light emitting device 140 is disposed over the driving circuit layer, which will be described below.

Figure 3:
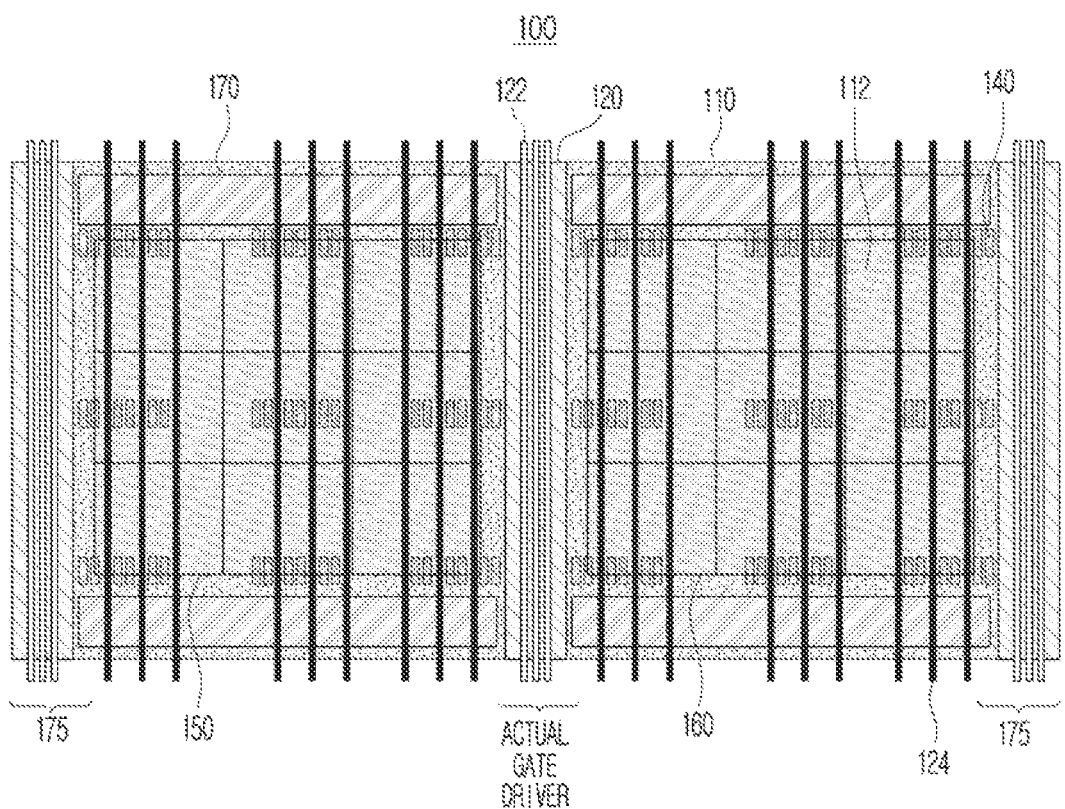
FIG. 3 is a diagram illustrating a pixel structure of a display module according to one or more embodiments of the disclosure.

First, referring to FIG. 3, a structure of the display module 100 according to an embodiment of the disclosure will described in detail.

FIG. 3 is a diagram illustrating a pixel structure of a display module according to one or more embodiments of the disclosure.

Referring to FIG. 3, the display module 100 may include the first driving circuit 120 which is provided in the vertical form at the center area on the substrate 110. According to an example, the first driving circuit 120 may divide the substrate 110 into the left area and the right area.

According to an embodiment, the display module 100 may be formed at the left area of the substrate 110 relative to the first driving circuit 120, and may include a first pixel array 150 in which each pixel 112 that includes the plurality of inorganic light emitting devices 140 is disposed in the matrix form, and may be formed at the right area of the substrate 110 relative to the first driving circuit 120, and may include a second pixel array 160 in which each pixel 112 that includes the plurality of inorganic light emitting devices 140 is disposed in the matrix form.

Here, the first pixel array 150 and the second pixel array 160 may be respectively disposed spaced apart by a pre-set distance from the first driving circuit 120.

In an embodiment, the plurality of pixels 112 included in the first pixel array 150 may be disposed to be in close contact with one another. For example, the plurality of pixels 112 included in the first pixel array 150 may be disposed to be in direct contact with one another in the matrix form.

In addition, the plurality of pixels 112 included in the second pixel array 160 may also be disposed to be in close contact with one another, and for example, the plurality of pixels 112 included in the second pixel array 160 may be disposed to be in direct contact with one another in the matrix form.

Meanwhile, each of the pixels 112 may include 3 types of sub pixels such as a red (R) sub pixel, a green (G) sub pixel, and a blue (B) sub pixel. Each sub pixel may include the plurality of inorganic light emitting devices 140 that form the sub pixels (e.g., R, G, B), and may emit light according to driving current provided from the second driving circuit 130.

For example, each of the pixels 112 included in each of the first pixel array 150 and the second pixel array 160 may include 3 types of inorganic light emitting devices 140 such as an R inorganic light emitting device corresponding to the R sub pixel, a G inorganic light emitting device corresponding to the G sub pixel, and a B inorganic light emitting device corresponding to the B sub pixel.

Alternatively, each pixel 112 may include 3 blue inorganic light emitting devices. In this case, a color filter for implementing the R, G, and B colors may be provided on each inorganic light emitting device 140. In an embodiment, the color filter may be a quantum dot (QD) color filter, but the disclosure is not limited thereto.

Here, the inorganic light emitting devices 140 may refer to light emitting devices manufactured using inorganic materials, different from Organic Light Emitting Diodes (OLEDs) manufactured using organic materials.

Specifically, according to one or more embodiments of the disclosure, the inorganic light emitting devices 140 may be micro light emitting diodes (LED) (μ-LED) having a size of less than or equal to 100 micrometers (μm). In this case, the display module 100 may be a micro LED display module in which each of the sub pixels are implemented as micro LEDs.

The micro LED display module may be formed of the plurality of inorganic LEDs that are respectively less than or equal to 100 micrometers.

The micro LED display module may provide better contrast, response time, and energy efficiency than a liquid crystal display (LCD) panel that requires a backlight. Meanwhile, the organic LED (OLED) and the micro LED both have good energy efficiency, but the micro LED may provide better performance than the OLED from a brightness, light emitting efficiency, and longevity aspect.

Specifically, because the micro LED includes a characteristic of efficiency improving when using a relatively high current as compared to the OLED, the micro LED display module 100 may provide, in order to provide a stable high current, driving voltage to the second driving circuit 130 through a metal layer separate from a metal layer on which a gate electrode of a thin film transistor (TFT) or a source or a drain electrode is formed which will be described below.

However, in one or more embodiments of the disclosure, the inorganic light emitting devices 140 are not necessarily limited to micro LEDs.

In each sub pixel, the second driving circuit 130 for driving the inorganic light emitting device 140 that forms the corresponding sub pixel may be provided based on a data voltage that is applied through a data line 124. Because the second driving circuit 130 is provided for each sub pixel, it may also be referred to as a sub pixel circuit.

The plurality of second driving circuits 130 formed on the substrate 110 according to an embodiment may be provided for each of the pixels 112, and may drive the plurality of inorganic light emitting devices 140 included in each pixel 112 that corresponds to the data lines 124.

The first driving circuit 120 according to an embodiment may generate a control signal for driving a plurality of second driving circuits 130 based on clock signals applied through the clock lines 122, and provide the generated clock signals to the plurality of second driving circuits 130.

In addition, according to one or more embodiments of the disclosure, unlike the display modules of the related art, the display module 100 may generate a control signal for driving the second driving circuit 130, and the first driving circuit 120 for providing the generated control signal to the second driving circuit 130 may be provided in an area between the first pixel array 150 and the second pixel array 160. At this time, the first driving circuit 120 may be, for example, a gate driver circuit (or a scan driver circuit).

As shown in FIG. 3, because the first pixel array 150 and the second pixel array 160 are disposed on the substrate 110, and the first driving circuit 120 and the second driving circuit 130 are provided in an active area of the display module 100 in which an image is displayed, it may be possible to implement a bezel-less display module 100.

In addition, unlike the display modules of the related art, because the display module 100 according to an embodiment of the disclosure is configured such that the pixels 112 are not disposed adjacent to the first driving circuit 120, a problem of brightness of a specific pixel deteriorating may not occur even when driving the first driving circuit 120. In addition, because the display module 100 according to an embodiment of the disclosure is configured such that the data line 124 (or, pixel line) corresponding to each of the pixels 112 is not overlapped at the first driving circuit 120, signal coupling may be avoided.

In addition, because the display module 100 according to an embodiment of the disclosure is configured such that the clock line 122 (or, the control signal line for applying a gate in panel (GIP) control signal) for applying the clock signal to the first driving circuit 120 is formed to overlap at the first driving circuit 120, signal coupling between the clock line 122 and the data line 124 may not occur. For example, the clock line 122 and the first driving circuit 120 may be formed at a same position on the substrate 110 at different layers from one another.

FIG. 3 is shown assuming that 18 pixels 112 may be formed on the substrate 110 for convenience of description, the first pixel array 150 including 9 pixels disposed in close contact in a 3×3 form, and the second pixel array 160 including 9 pixels disposed in close contact in a 3×3 form, but the disclosure is not limited thereto. For example, the pixel array may include a plurality of pixels 112 disposed in close contact in various matrix forms such as, for example, and without limitation, a 2×3 form, a 4×4 form, and the like.

Figure 4:
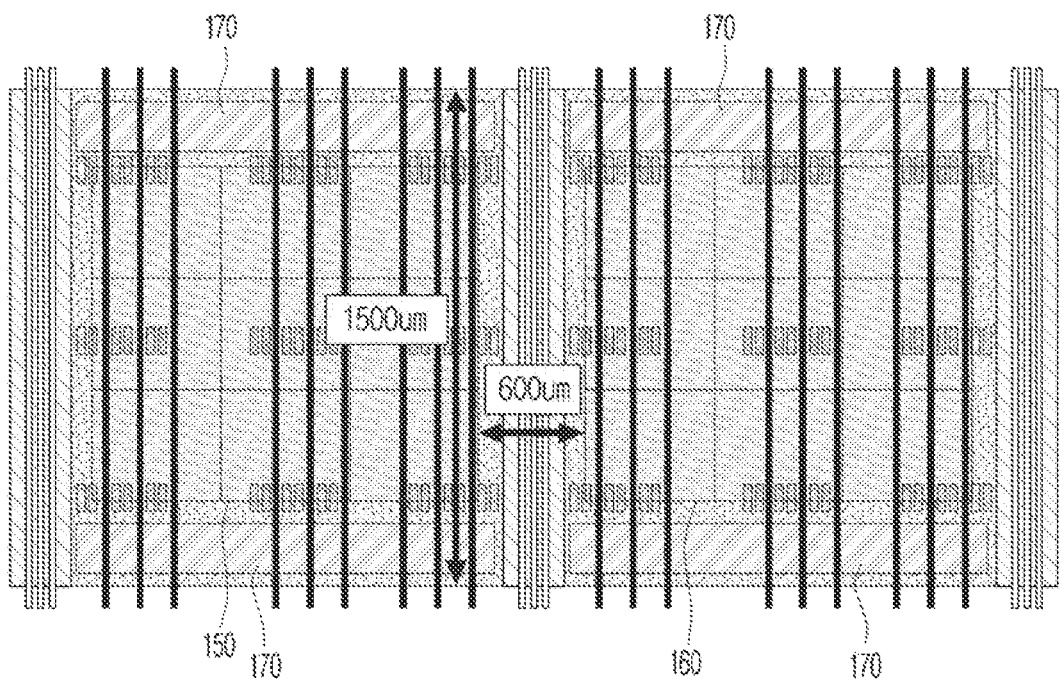
FIG. 4 is a diagram illustrating a distance between pixel arrays according to one or more embodiments of the disclosure.

FIG. 4 is a diagram illustrating a distance between pixel arrays according to one or more embodiments of the disclosure.

In the related art, the plurality of pixels have been disposed in the matrix form with a certain distance therebetween on the substrate 110, but as shown in FIG. 1, an area of a designed area is smaller than an area of an allocated design area. Accordingly, the area left empty by design on the substrate 110 may cause a load effect by a difference in pattern density during a photolithography process.

As shown in FIG. 3, the plurality of pixels 112 included in the pixel array may be disposed closely with one another, but a position of a μLED PAD may be maintained the same as the bezel-less display module of the related art. That is, each of the inorganic light emitting devices 140 included in the first pixel array 150 may be disposed spaced apart from one another, and each of the inorganic light emitting devices 140 included in the second pixel array 160 may be disposed spaced apart from each other.

As shown in FIGS. 3 and 4, because the plurality of pixels 112 are disposed closely with one another, a designable redundant area 170 may be present on the substrate 110.

For example, referring to FIG. 4, if each of the first pixel array 150 and the second pixel array 160 include 9 pixels disposed in close contact in the 3×3 form, the redundant area 170 may be present on the substrate 110 more than is possible on the display module of the related art. Here, the redundant area 170 may mean an area in which the inorganic light emitting devices 140 are not disposed.

For example, a portion of an upper area and a portion of a lower area in the left area relative to the first driving circuit 120 may be the redundant area 170 in which the inorganic light emitting devices 140 are not disposed, and a portion of the upper area and a portion of the lower area in the right area relative to the first driving circuit 120 may be the redundant area 170 in which the inorganic light emitting devices 140 are not disposed.

Each of the first pixel array 150 and the second pixel array 160 may be disposed spaced apart by a pre-set distance from the first driving circuit 120 using the redundant area 170 on the substrate 110. Here, the pre-set distance may include an arbitrary distance which can prevent the occurrence of brightness deterioration in a specific pixel 112 due to driving of the first driving circuit 120, and the occurrence of the signal coupling phenomenon between the clock line 122 and the data line 124.

Figure 5:
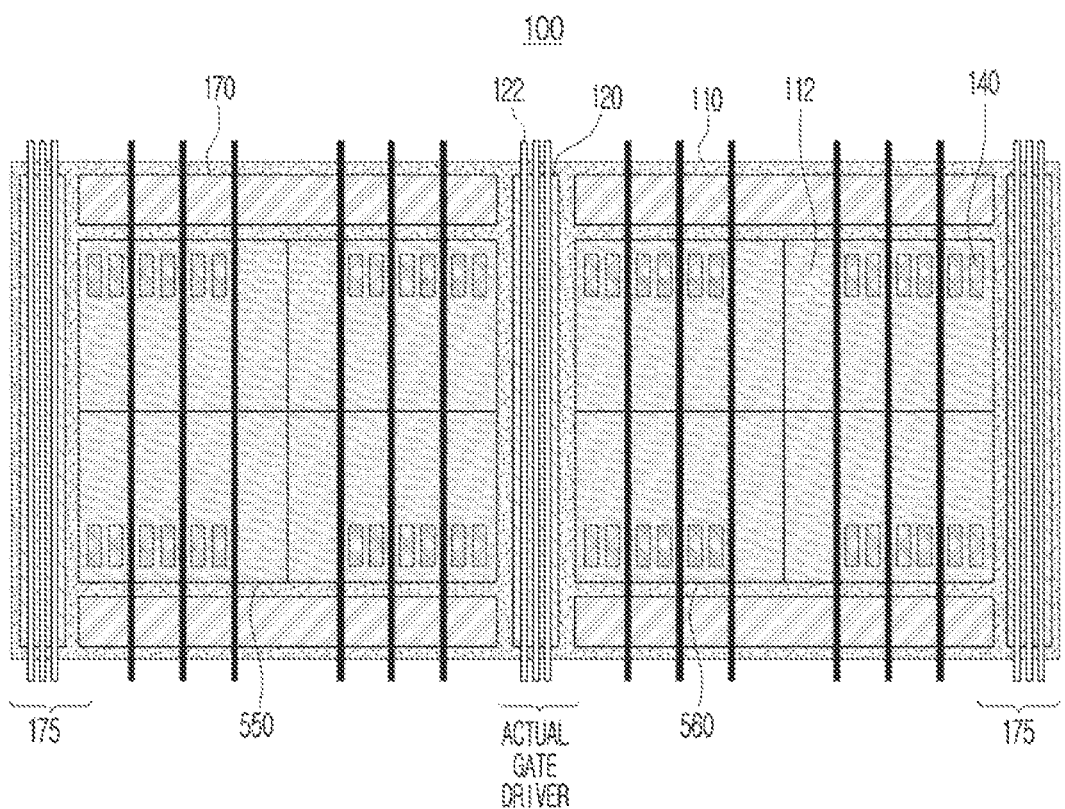
FIG. 5 is a diagram illustrating a pixel structure of a display module according to one or more embodiments of the disclosure.

FIG. 5 is a diagram illustrating a pixel structure of a display module according to one or more embodiments of the disclosure.

Referring to FIG. 5, each of the first pixel array 550 and the second pixel array 560 according to an embodiment of the disclosure may include a plurality of pixels 112 disposed in close contact with one another in the 2×2 form.

For example, 8 pixels may be formed on the substrate 110, the first pixel array 550 may include 4 pixels disposed in close contact in the 2×2 form, and the second pixel array 560 may include 4 pixels disposed in close contact in the 2×2 form. The embodiment described above is provided for convenience of description, and the disclosure is not limited thereto.

Referring to FIG. 3 and FIG. 5, a dummy first driving circuit 175 may be provided at each of a left outer area in the left area and a right outer area in the right area on the substrate 110.

Here, the dummy first driving circuit 175 may not be a configuration for generating and transmitting control signals for driving the second driving circuit 130, but may include the same (or, similar) circuits as with the first driving circuit 120.

For example, each of the first driving circuit 120, and the dummy first driving circuit 175 may include a thin film transistor (TFT), and the second driving circuit 130 may include the TFT.

According to an embodiment, because the substrate 110 includes a circuit pattern of which the left side and the right side are symmetrical based on the first driving circuit 120 in the vertical form, causing the load effect by the difference in pattern density during the photolithography process may be prevented.

Meanwhile, the dummy first driving circuits 175 may not be in a floating state, and may maintain a same potential with the first driving circuit 120.

For example, nodes of each of the dummy first driving circuits 175 may all maintain the same potential using a constant voltage lines such as, for example, and without limitation, VGH, VGL, driving voltage (VDD), ground voltage (VSS), and the like, and accordingly, image noise by the floating pattern may be prevented.

Figure 6:
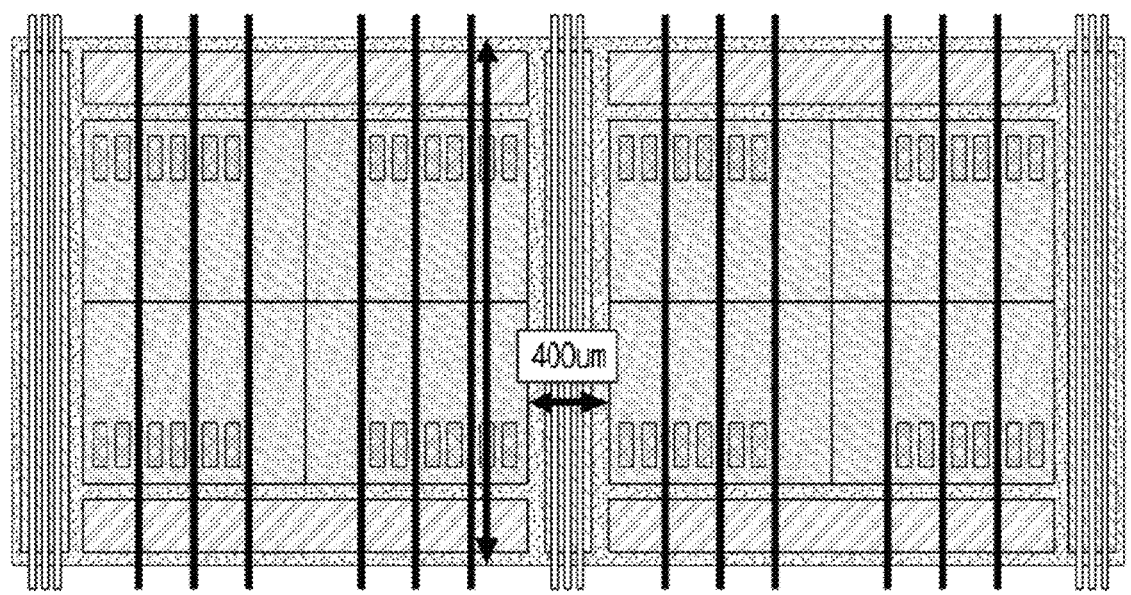
FIG. 6 is a diagram illustrating a distance between pixel arrays according to one or more embodiments of the disclosure.

FIG. 6 is a diagram illustrating a distance between pixel arrays according to one or more embodiments of the disclosure.

As shown in FIG. 4 and FIG. 6, if the plurality of pixels 112 are grouped, that is, designed such that the plurality of pixels are disposed in close contact with one another, a redundant space 170 may be present on the substrate 110. For example, the 3×3 form may be 600 um, and the 2×2 form may be 400 um, and the more grouping is carried out, the first driving circuit 120, that is, an area in which the gate driver can be designed, may become wider. As in the above-described embodiment, 400 um, 600 um, and the like are sufficient areas to design the first driving circuit 120 in the vertical form.

Referring back to FIG. 2, the display module 100 according to an embodiment of the disclosure may include various circuits for driving the plurality of inorganic light emitting devices 140. Specifically, the second driving circuit 130 may provide driving current to the plurality of inorganic light emitting devices 140. Specifically, the second driving circuit 130 may provide driving current which is limited in magnitude and driving time to the inorganic light emitting devices 140 based on data voltage, driving voltage, and various control signals applied from the first driving circuit 120.

That is, the second driving circuit 130 may pulse amplitude modulation (PAM) drive and/or pulse width modulation (PWM) drive the inorganic light emitting devices 140 and control the brightness of light emitted by the inorganic light emitting devices 140.

To this end, the second driving circuit 130 may include a PAM circuit for providing driving current of a magnitude corresponding to PAM data voltage to the inorganic light emitting device 140, and/or a PWM circuit for providing driving current provided from the PAM circuit to the inorganic light emitting device 140 for a time corresponding to PWM data voltage.

Specifically, when operating the inorganic light emitting devices 140 in a PWM driving method, various grayscales may be represented by differing driving times of driving current even if the magnitude of the driving current is the same. Accordingly, because a problem of a wavelength of light emitted by the inorganic light emitting device changing according to the magnitude of the driving current can be solved, a more enhanced color reproducibility may be implemented.

The first driving circuit 120 may be a driving circuit for driving the second driving circuit 130. That is, the first driving circuit 120 may generate a control signal for operating the second driving circuit 130 and provide the same to the first driving circuit 120.

Specifically, the first driving circuit 120 may receive input of a plurality of clock signals and a control signal (e.g., a reset signal, a start signal, etc.) for controlling an operation of the first driving circuit 120 and generate a control signal for controlling an operation of the second driving circuit 130, and provide the generated control signal to the second driving circuit 130.

For example, the first driving circuit 120 may generate various control signals for driving, in a row line basis, the pixel array of the display module 100 in which the pixels 112 that are disposed in close contact with one another in the matrix form are arranged, and provide the same to the second driving circuit 130.

The first driving circuit 120 in one or more embodiments of the disclosure may refer to at least a portion of the gate drivers (or scan drivers) for driving the plurality of pixels (or sub pixels) in the row line basis, and may sequentially drive the second driving circuits 130 of the sub pixels that form each pixel of the pixel array by each row line.

The second driving circuit 130 for driving each inorganic light emitting device on the substrate 110 may be present for each inorganic light emitting device 140.

Each of the inorganic light emitting devices 140 may be respectively mounted or disposed on the substrate 110 to be electrically connected with the corresponding second driving circuit 130.

For example, the R inorganic light emitting device may be mounted or disposed on the substrate 110 such that an anode electrode and a cathode electrode are respectively connected to an anode electrode and a cathode electrode of the second driving circuit 130, and the above is the same for the G inorganic light emitting device and the B inorganic light emitting device.

The inorganic light emitting device 140 may not be limited to a micro LED of a flip chip type, and may be a micro LED of a lateral type or a vertical type according to one or more embodiments.

According to one or more embodiments of the disclosure, the display module 100 may further include various circuits for driving the second driving circuit 130 in addition to the first driving circuit 120.

Here, the various circuity may include a source driver circuit (or a data driver circuit) for providing data voltage (e.g., PAM data voltage or PWM data voltage) to each pixel (or each sub pixel) of the pixel array disposed in the matrix form.

In addition, each circuit may include a MUX circuit for selecting a plurality of sub pixels, respectively, that form a pixel.

In addition, the various circuits may include a driving voltage providing circuit for providing various driving voltages to each second driving circuit 130 included in the display module 100.

In addition, the various circuits may include a clock signal providing circuit that provides various clock signals for driving the gate driver circuit or the data driver circuit, and include a sweep voltage providing circuit for providing sweep voltage (e.g., voltage that linearly changes according to time between two voltages different from each other) necessary for driving the PWM circuit.

Alternatively, at least a portion from among the above-described various circuits may be implemented in a separate chip form and mounted to an external printed circuit board (PCB) together with a timing controller (TCON), and may be connected with the second driving circuits 130 formed at a TFT layer of the display module 100 through a film on glass (FOG) wiring.

Alternatively, at least a portion from among the above-described various circuits may be implemented in a separate chip form and disposed on a film in a chip on film (COF) form, and connected with the second driving circuits 130 formed at the TFT layer of the display module 100 through the FOG wiring.

Alternatively, at least a portion from among the above-described various circuits may be implemented in a separate chip form and disposed in the COG form (that is, disposed at a back surface (an opposite surface of a surface on which the TFT layer is formed based on the glass substrate) of the glass substrate of the display module 100), and connected with the second driving circuits 130 formed at the TFT layer of the display module 100 through connecting wiring.

For example, among the above-described various circuits, the sweep voltage providing circuit and the MUX circuit may be formed on the driving circuit layer, the data driver circuit may be disposed at the back surface of the glass substrate of the display module 100, and the driving voltage providing circuit, the clock signal providing circuit, and the TCON may be disposed on the PCB, but is not limited thereto.

According to one or more embodiments of the disclosure as described above, a bezel-less display module may be provided. In addition, designing of an optimized driving circuit may be possible, and an inorganic light emitting device may be stably driven. In addition, a display module having enhanced color reproducibility may be provided. In addition, the disclosure may contribute toward making the display panel small and lightweight.

In addition, in the above-described embodiments of the disclosure, the TFT that forms the TFT layer (or TFT panel) is not limited to a specific structure or type. That is, the TFT referred to in one or more embodiments of the disclosure may be implemented with a low temperature poly silicon (LTPS) TFT, an oxide TFT, a poly silicon or a-silicon (TFT), an organic TFT, a graphene TFT, and the like, and may be applied by manufacturing only a P type (or a N-type) MOSFET in a Si wafer CMOS process.

While the disclosure has been illustrated and described with reference to one or more embodiments thereof, it will be understood that the various example embodiments are intended to be illustrative, not limiting. It will be understood by those skilled in the art that various changes in form and details may be made therein without departing from the true spirit and full scope of the disclosure, including the appended claims and their equivalents.

What is claimed is:

1. A display module comprising:
   a substrate;
   a first driving circuit provided in a center area on the substrate in a vertical form;
   a first pixel array formed on a left area of the substrate relative to the first driving circuit, wherein the first pixel array comprises a first plurality of pixel areas disposed in a matrix form;
   a second pixel array formed on a right area of the substrate relative to the first driving circuit, wherein the second pixel array comprises a second plurality of pixel areas disposed in the matrix form;
   a first dummy first driving circuit disposed at an outer portion of the left area; and
   a second dummy first driving circuit disposed at an outer portion of the right area,
   wherein each pixel area of the first plurality of pixel areas and each pixel area of the second plurality of pixel areas comprises a plurality of inorganic light emitting devices,
   wherein each of the first pixel array and the second pixel array are separated from the first driving circuit by a pre-set distance,
   wherein adjacent edges of pixel areas of the first plurality of pixel areas are in direct contact with one another and adjacent edges of pixel areas of the second plurality of pixel areas are in direct contact with one another, and
   wherein each of the first dummy first driving circuit and the second dummy first driving circuit is configured to maintain the same potential as the first driving circuit and is symmetrically disposed to the left area and the right area relative to the first driving circuit.

2. The display module of claim 1, further comprising:
   a plurality of second driving circuits formed on the substrate,
   wherein the plurality of second driving circuits are configured to drive the plurality of inorganic light emitting devices of the first plurality of pixel areas and the second plurality of pixel areas, and
   wherein the first driving circuit is configured to generate control signals based on clock signals applied through at least one clock line, and to drive the plurality of second driving circuits by providing the generated control signals to the plurality of second driving circuits.

3. The display module of claim 2, wherein the at least one clock line overlaps the first driving circuit on the substrate.

4. The display module of claim 1, wherein the vertical form of the first driving circuit divides the substrate into the left area and the right area.

5. The display module of claim 4, wherein the plurality of inorganic light emitting devices in the first pixel array are spaced apart from one another, and
   wherein the plurality of inorganic light emitting devices in the second pixel array are spaced apart from one another.

6. The display module of claim 1, wherein the left area of the substrate and the right area of the substrate are symmetrical across the vertical form of the first driving circuit.

7. The display module of claim 1, wherein each of the first driving circuit, the first dummy first driving circuit and the second dummy first driving circuit comprises a thin film transistor.

8. A display module comprising:
   a substrate;
   a first driving circuit on the substrate and configured to divide the substrate into a first side and a second side;
   a first pixel array on the first side of the substrate, the first pixel array comprising a first plurality of pixel areas;
   a second pixel array on the second side of the substrate, the second pixel array comprising a second plurality of pixel areas;
   a first dummy first driving circuit disposed at an outer portion of the first side; and
   a second dummy first driving circuit disposed at an outer portion of the second side, wherein the first plurality of pixel areas and the second plurality of pixel areas are arranged in a matrix form, wherein each pixel area of the first plurality of pixel areas and each pixel area of the second plurality of pixel areas comprises a plurality of inorganic light emitting devices, wherein each of the first pixel array and the second pixel array are separated from the first driving circuit by a pre-set distance, and wherein adjacent edges of pixel areas of the first plurality of pixel areas are in direct contact with one another and adjacent edges of pixel areas of the second plurality of pixel areas are in direct contact with one another, and wherein each of the first dummy first driving circuit and the second dummy first driving circuit is configured to maintain the same potential as the first driving circuit and is symmetrically disposed to the first side and the second side relative to the first driving circuit.

9. The display module of claim 8, further comprising:
a plurality of second driving circuits on the substrate;
at least one data line on the substrate; and
at least one clock line on the substrate,
wherein the plurality of second driving circuits are configured to drive the plurality of inorganic light emitting devices of the first plurality of pixel areas and the second plurality of pixel areas, and
wherein the first driving circuit is configured to generate control signals based on clock signals applied through the at least one clock line, and to drive the plurality of second driving circuits by providing the generated control signals to the plurality of second driving circuits.

10. The display module of claim 9, wherein the at least one clock line overlaps the first driving circuit on the substrate.

11. The display module of claim 8, wherein adjacent inorganic light emitting devices of the plurality of inorganic light emitting devices are spaced apart from one another.

12. The display module of claim 1, wherein the first side and the second side are symmetrical across the first driving circuit.

13. A display module comprising:
a substrate;
a first pixel array on a first side of the substrate, the first pixel array comprising a first plurality of pixel areas;
a second pixel array on a second side of the substrate, the second pixel array comprising a second plurality of pixel areas;
a first driving circuit on the substrate between the first pixel array and the second pixel array;
a first dummy first driving circuit disposed at an outer portion of the first side; and
a second dummy first driving circuit disposed at an outer portion of the second side,
wherein each of the first pixel array and the second pixel array are separated from the first driving circuit by a pre-set distance, and
wherein adjacent edges of pixel areas of the first plurality of pixel areas are in direct contact with one another and adjacent edges of pixel areas of the second plurality of pixel areas are in direct contact with one another, and
wherein each of the first dummy first driving circuit and the second dummy first driving circuit is configured to maintain the same potential as the first driving circuit and is symmetrically disposed to the first side and the second side relative to the first driving circuit.

14. The display module of claim 1,
wherein a portion of an upper area and a portion of a lower area in the left area are a first redundant area in which an inorganic light emitting device is not disposed, and
wherein a portion of the upper area and a portion of the lower area in the right area are a second redundant area in which an inorganic light emitting device is not disposed.

15. The display module of claim 8, further comprising:
a first redundant area at an upper edge portion of the first side and a lower edge portion of the first side; and
a second redundant area at an upper edge portion of the second side and a lower edge portion of the second side,
wherein no inorganic light emitting devices are in the first redundant area and the second redundant area.

* * * * *